(12) United States Patent
Liu et al.

(10) Patent No.: US 7,518,148 B2
(45) Date of Patent: Apr. 14, 2009

(54) FULL FAULT TOLERANT ARCHITECTURE FOR ORGANIC ELECTRONIC DEVICES

(75) Inventors: Jie Liu, Niskayuna, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 21 days.

(21) Appl. No.: 11/092,488

(22) Filed: Mar. 29, 2005

(65) Prior Publication Data

US 2006/0226522 A1 Oct. 12, 2006

(51) Int. Cl.
*H01L 27/15* (2006.01)

(52) U.S. Cl. ............ 257/79; 257/E27.14; 257/E23.082; 315/165

(58) Field of Classification Search ................. 315/185; 257/79, E23.082, E27.14
See application file for complete search history.

(56) References Cited

U.S. PATENT DOCUMENTS

| | | | |
|---|---|---|---|
| 4,298,869 A | 11/1981 | Okuno et al. | |
| 4,939,426 A * | 7/1990 | Menard et al. | 315/192 |
| 6,566,808 B1 | 5/2003 | Duggal et al. | 313/512 |
| 6,693,296 B1 | 2/2004 | Tyan | 257/40 |
| 6,800,999 B1 | 10/2004 | Duggal et al. | 315/169.1 |
| 7,045,965 B2 * | 5/2006 | Li et al. | 315/185 S |
| 2003/0116773 A1 | 6/2003 | Kraus et al. | |
| 2004/0021425 A1 | 2/2004 | Foust et al. | 315/169.3 |
| 2004/0118444 A1 | 6/2004 | Duggal et al. | 136/244 |
| 2004/0183067 A1 | 9/2004 | Strip | 257/40 |
| 2005/0174064 A1* | 8/2005 | Agostinelli et al. | 315/169.3 |

FOREIGN PATENT DOCUMENTS

EP 1460884 9/2004

OTHER PUBLICATIONS

Anil R. Duggal, Donald F. Foust, William F. Nealon, and Christian M. Heller, Fault-tolerant, scalable organic light-emitting device architecture, Applied Physics Letters, vol. 82, No. 16, Apr. 21, 2003, pp. 2580-2582.

* cited by examiner

*Primary Examiner*—Howard Weiss
*Assistant Examiner*—John C Ingham
(74) *Attorney, Agent, or Firm*—Mary Louise Gioeni

(57) ABSTRACT

An organic device package that provides full fault tolerance against both electrical shorts and electrical opens is presented. An organic device package comprising a plurality of groups of organic electronic elements electrically coupled in series, where at least one of the plurality of groups of organic electronic elements comprises a plurality of sub-groups of organic electronic elements electrically coupled in parallel, and where at least one of the plurality of sub-groups of organic electronic elements comprises a plurality of organic electronic elements electrically coupled in series. Further, various embodiments are contemplated where a plurality of series blocks and parallel blocks may be nested to provide a grid network having increased flexibility and fault tolerance.

24 Claims, 11 Drawing Sheets

FULL FAULT TOLERANT ARCHITECTURE FOR ORGANIC ELECTRONIC DEVICES

STATEMENT REGARDING FEDERALLY SPONSORED RESEARCH & DEVELOPMENT

This invention was made with Government support under contract number 70NANB3H3030 awarded by National Institute of Standards and Technology. The Government has certain rights in the invention.

BACKGROUND

The invention relates generally to lighting devices, and more particularly to organic electronic devices.

Currently, organic electronic devices, such as, but not limited to, organic light emitting diodes (OLEDs), are being increasingly employed for display applications and for lighting applications. In the last decade, tremendous progress has been made in the area of OLEDs. Previously, liquid crystal displays (LCDs) were employed for most display applications. However, the LCD displays involve high production and commercial expenses.

With the imaging appliance revolution underway, the need for more advanced devices that provide advanced display and/or lighting features is increasing. Further, it is often desirable to combine the attributes of a computer, personal digital assistant (PDA), and cell phone, along with the aforementioned display and/or lighting features. In addition, the need for new lightweight, low power, wide viewing angled devices have fueled an emerging interest in developing flat panel displays while circumventing high production and commercial expenses associated with liquid crystal displays. Consequently, the flat panel industry is looking to employ new displays such as OLEDs.

As will be appreciated by one skilled in the art, the OLED includes a stack of thin organic layers sandwiched between two charged electrodes. The organic layers include a hole injection layer, a hole transport layer, an emissive layer, and an electron transport layer. Upon application of an appropriate voltage to the OLED lighting device, where the voltage is typically between 2 and 10 volts, the injected positive and negative charges recombine in the emissive layer to produce light. Further, the structure of the organic layers and the choice of anode and cathode are designed to maximize the recombination process in the emissive layer, thus maximizing the light output from the OLED device. This structure eliminates the need for bulky and environmentally undesirable mercury lamps and yields a thinner, more versatile and more compact display or lighting device. In addition, OLEDs advantageously consume relatively little power. This combination of features enable OLED displays to advantageously communicate information in a more engaging way while adding less weight and taking up less space. Further, this combination of features may also provide smaller, lighter and more versatile devices used for area lighting applications.

However, the development of large area OLEDs is difficult due to failures of the OLED devices owing to the presence of local defects that cause electrical shorts and electrical opens. Typically, particle contamination during fabrication, asperities from electrode roughness and non-uniformities in organic layer thickness may cause shorting between the anode and cathode of the OLED. Also, a loss of electrical connectivity in an OLED may cause an electrical open.

It may therefore be desirable to develop a robust device architecture that advantageously provides fault tolerance against both electrical shorts and electrical opens.

BRIEF DESCRIPTION

Briefly, in accordance with aspects of the present technique, an organic device package is presented. The organic device package includes a plurality of groups of organic electronic elements electrically coupled in series, where at least one of the plurality of groups of organic electronic elements includes a plurality of sub-groups of organic electronic elements electrically coupled in parallel, and where at least one of the plurality of sub-groups of organic electronic elements includes a plurality of elements electrically coupled in series.

In accordance with further aspects of the present technique, an organic device package is presented. The organic device package includes a plurality of modules of organic electronic elements electrically coupled in series, where at least one of plurality of the modules of organic electronic elements includes a plurality of groups of organic electronic elements electrically coupled in parallel, and where at least one of the plurality of groups of organic electronic elements includes a plurality of sub-groups of organic electronic elements electrically coupled in series, and where at least one of the plurality of sub-groups of organic electronic elements includes a plurality of elements electrically coupled in parallel.

According to further aspects of the present technique, an organic device package is presented. The organic device package includes a first organic electronic element coupled between a first node and a second node. Further, the organic device package includes a second organic electronic element coupled between the second node and a third node, where the first and second organic electronic elements are electrically coupled in series to form a first sub-group. In addition, the organic device package includes a third organic electronic element coupled between the first node and a fourth node. Moreover, the organic device package includes a fourth organic electronic element coupled between the fourth node and the third node, where the third and fourth organic electronic elements are electrically coupled in series to form a second sub-group, and where the first and second sub-groups are electrically coupled in parallel to form a group.

According to further aspects of the present technique, a method of fabricating an organic device package is presented. The method includes providing a substrate. The method also includes patterning a plurality of bottom electrodes on the substrate. Further, the method includes disposing an organic layer on the plurality of bottom electrodes. In addition, the method includes patterning the organic layer to form a plurality of openings, where the openings are configured to facilitate electrical coupling between the bottom and top electrodes of the organic device package. Additionally, the method includes patterning a plurality of top electrodes on the organic layer, where at least two of the bottom or top electrodes are electrically coupled in parallel.

According to further aspects of the present technique, a method of fabricating an organic device package is presented. The method includes electrically coupling in series a plurality of organic electronic elements to form a sub-group. Further, the method includes electrically coupling in parallel a plurality of sub-groups to form a group. In addition, the method includes electrically coupling in series a plurality of groups.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Organic materials are poised to transform the world of circuit and display technology and have been attracting much attention due to the low cost and high performance offered by organic electronic devices and opto-electronic devices. For example, organic electronic device displays have been attracting much attention in recent years for their superior performance and attributes in the areas of contrast, thinness, power consumption, lightness, response speed and viewing angle. However, the development of large area OLEDs is difficult due to fabrication techniques, which may result in local defects that cause electrical shorts and electrical opens and thus, failures of the OLED devices during operation. Typically, particle contamination during fabrication, asperities from electrode roughness and non-uniformities in organic layer thickness may cause shorting between the anode and cathode of the OLED. Likewise, electrical opens may be caused due to mis-alignment of interconnect, a loss of electrical connectivity, and/or incomplete removal of organic materials. It may therefore be desirable to develop a robust device architecture that advantageously provides fault tolerance against both electrical shorts and electrical opens. The techniques discussed herein address some or all of these issues.

Figure 1:
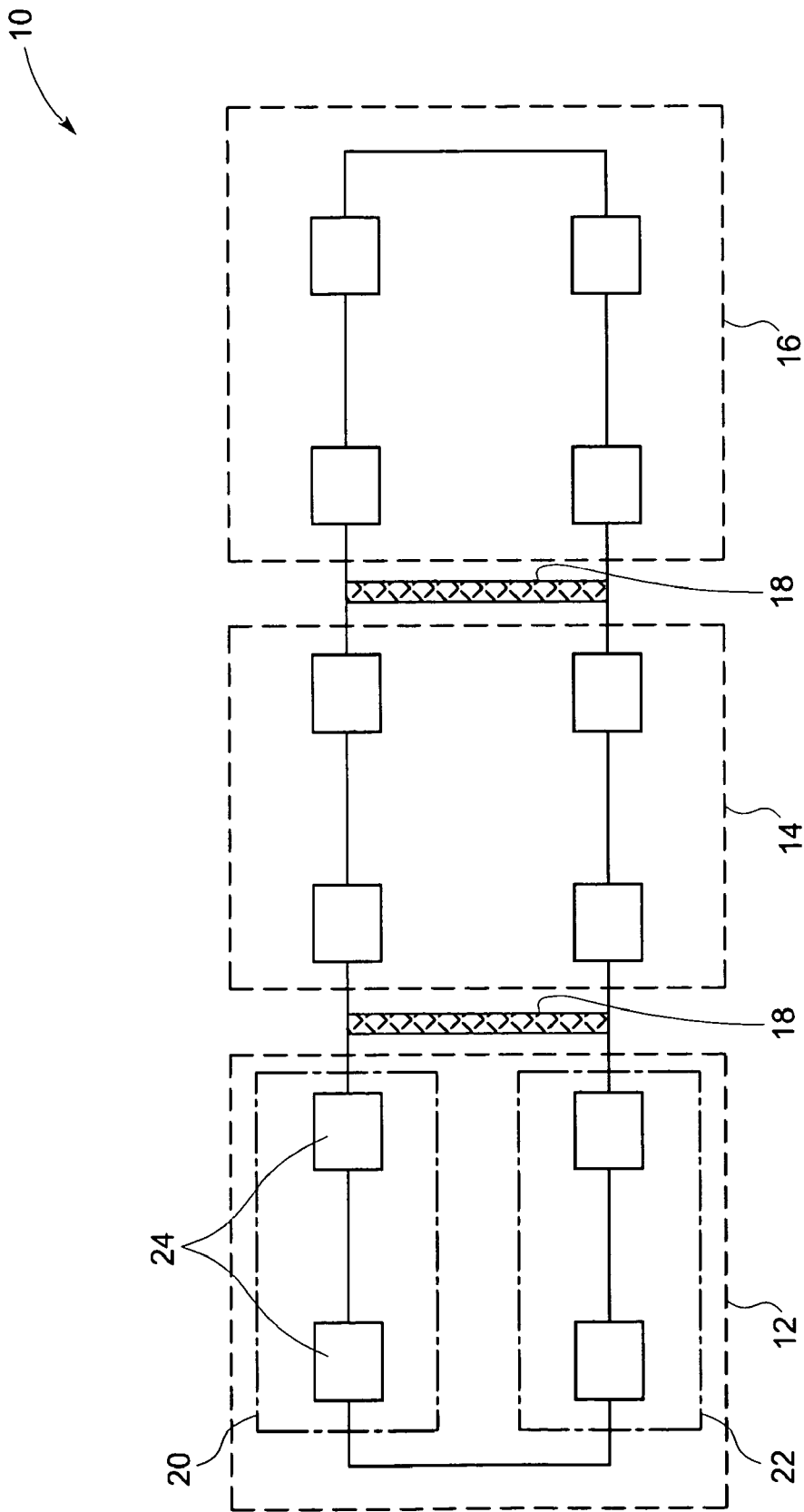
FIG. 1 illustrates a schematic diagram of an exemplary embodiment of an organic device package, according to aspects of the present technique.

Referring to FIG. 1, a first exemplary embodiment of an organic device package 10 is illustrated. In a presently contemplated configuration, the organic device package 10 is illustrated diagrammatically as having a plurality of groups of organic electronic elements. In one embodiment, each of the plurality of organic electronic elements may include an organic electronic device. In the illustrated embodiment, the organic device package 10 is shown to include a first group 12, a second group 14 and a third group 16 of organic electronic elements. However, as will be appreciated by one skilled in the art, in alternate embodiments of the present technique, a lesser or greater number of groups of organic electronic elements may be envisaged. The groups 12, 14, 16 of organic electronic elements may be arranged such that the groups 12, 14, 16 are electrically coupled in series. The first and second groups 12, 14 of organic electronic elements may be electrically coupled in series via a series interconnection area 18. In a similar fashion, the second and third groups 14, 16 of organic electronic elements may be electrically coupled in series via the series interconnection area 18.

Further, in accordance with aspects of the present technique, at least one of the plurality of groups 12, 14, 16 of organic electronic elements may include a plurality of sub-groups of organic electronic elements that may be electrically connected with each other in a parallel configuration. In the illustrated embodiment, the first group 12 is depicted as having two sub-groups. However, as will be appreciated by one skilled in the art, in alternate embodiments of the present technique, a greater number of sub-groups of organic electronic elements may be envisioned. In one embodiment, the first group 12 of organic electronic elements may include a first sub-group 20 of organic electronic elements and a second sub-group 22 of organic electronic elements, as illustrated in FIG. 1. The first and second sub-groups 20, 22 of organic electronic elements may be arranged such that the first and second sub-groups 20, 22 are electrically coupled in parallel to form the first group 12.

In addition, in accordance with further aspects of the present technique, at least one of the plurality of sub-groups 20, 22 of organic electronic elements may include a plurality of organic electronic elements 24 that may be electrically connected in a series arrangement. Further, in certain embodiments, each of the plurality of organic electronic elements 24 may include an organic electronic device. Additionally, each of the plurality of organic electronic elements 24 may include one of an organic light emitting device, an organic photovoltaic cell, an organic electrochromic device, an organic transistor, an organic integrated circuit, an organic sensor, or a photo-detector. Moreover, each of the plurality of organic electronic elements 24 may include a respective bottom electrode and a top electrode. In one embodiment, the bottom electrode may include an anode and the top electrode may include a cathode. The series coupling between two adjacently disposed organic electronic elements 24, such as organic electronic devices, may be achieved by coupling the cathode of one organic electronic element with the anode of an adjacent organic electronic element.

With continuing reference to the sub-groups 20, 22 of organic electronic elements, the first sub-group 20 may include a plurality of organic electronic elements 24, such as organic electronic devices, that may be electrically coupled in series. Similarly, the second sub-group 22 may also include a plurality of organic electronic elements 24 electrically coupled in series. For example, in one embodiment, the first sub-group 20 may include two organic electronic elements 24 electrically coupled in series. Likewise, the second sub-group 22 may also include two organic electronic elements 24 electrically coupled in series. In FIG. 1, each of the first and second sub-groups 20, 22 is illustrated as having two organic electronic elements 24 electrically connected in a series arrangement. However, as will be appreciated by one skilled in the art, the first and second sub-groups 20, 22 may include more than two organic electronic elements 24 electrically coupled in series.

Furthermore, FIG. 1 illustrates an exemplary embodiment of the organic device package 10 having a "three-tier architecture". In other words, a Series/Parallel/Series model of the organic device package 10 is depicted in FIG. 1. The plurality of organic electronic elements 24 is electrically coupled in series to form a sub-group of organic electronic elements. Further, the plurality of sub-groups 20, 22 is electrically coupled in parallel to form a group of organic electronic elements. In addition, the plurality of groups 12, 14, 16 is electrically coupled in series to form the organic device package 10.

The exemplary three-tier architecture illustrated in FIG. 1 advantageously provides full fault tolerance to both electrical opens and electrical shorts. The three-tier architecture depicted in FIG. 1 is tolerant to an open failure in any one of the organic electronic elements 24 in the groups 12, 14, 16. In the eventuality of an electrical open in one of the groups 12, 14, 16, current flow through the organic device package 10 may be maintained via the exemplary parallel coupling between the plurality of sub-groups 20, 22. For instance, if one of the organic electronic elements 24 in the first sub-group 20 fails open, no current flows through the first sub-group 20. Consequently, the current flows through the second sub-group 22. Thus, in the group 12, there exists an alternate path for current flow in the eventuality of an electrical open in one of the organic electronic elements 24 in the first group 12. The illustrated embodiment thereby facilitates tolerance of the organic device package 10 to electrical opens.

Typically, a short failure in one of the organic electronic elements 24 in one of the groups 12, 14, 16 may result in reduction of current to the other organic electronic elements 24 in that group. This deficiency may be overcome by the exemplary arrangement of the organic device package 10 illustrated in FIG. 1. On occurrence of a short failure in one of the organic electronic elements 24 in the organic device package 10, current flow through the path including the electrical short is sustained as current continues to flow through the other organic electronic elements 24 in the sub-groups 20, 22. For example, in the first group 12, if there is a short failure in one of the organic electronic elements 24 in the first sub-group 20, current flows through the electrical short and through the other organic electronic elements 24 in the first sub-group 20. In addition, current also flows through the second sub-group 22. Thus, there exists a continuous path for current flow even in the eventuality of an electrical short in one of the organic electronic elements 24 in the first group 12. The illustrated embodiment thereby facilitates tolerance of the organic device package 10 to electrical shorts. Advantageously, in accordance with aspects of the present technique, the exemplary three-tier architecture of the organic device package 10 illustrated in FIG. 1 does not necessitate the use of a fuse to provide fault tolerance against electrical shorts. The inclusion of a fuse may disadvantageously increase the complexity of the fabrication process and result in higher production costs.

Figure 2:
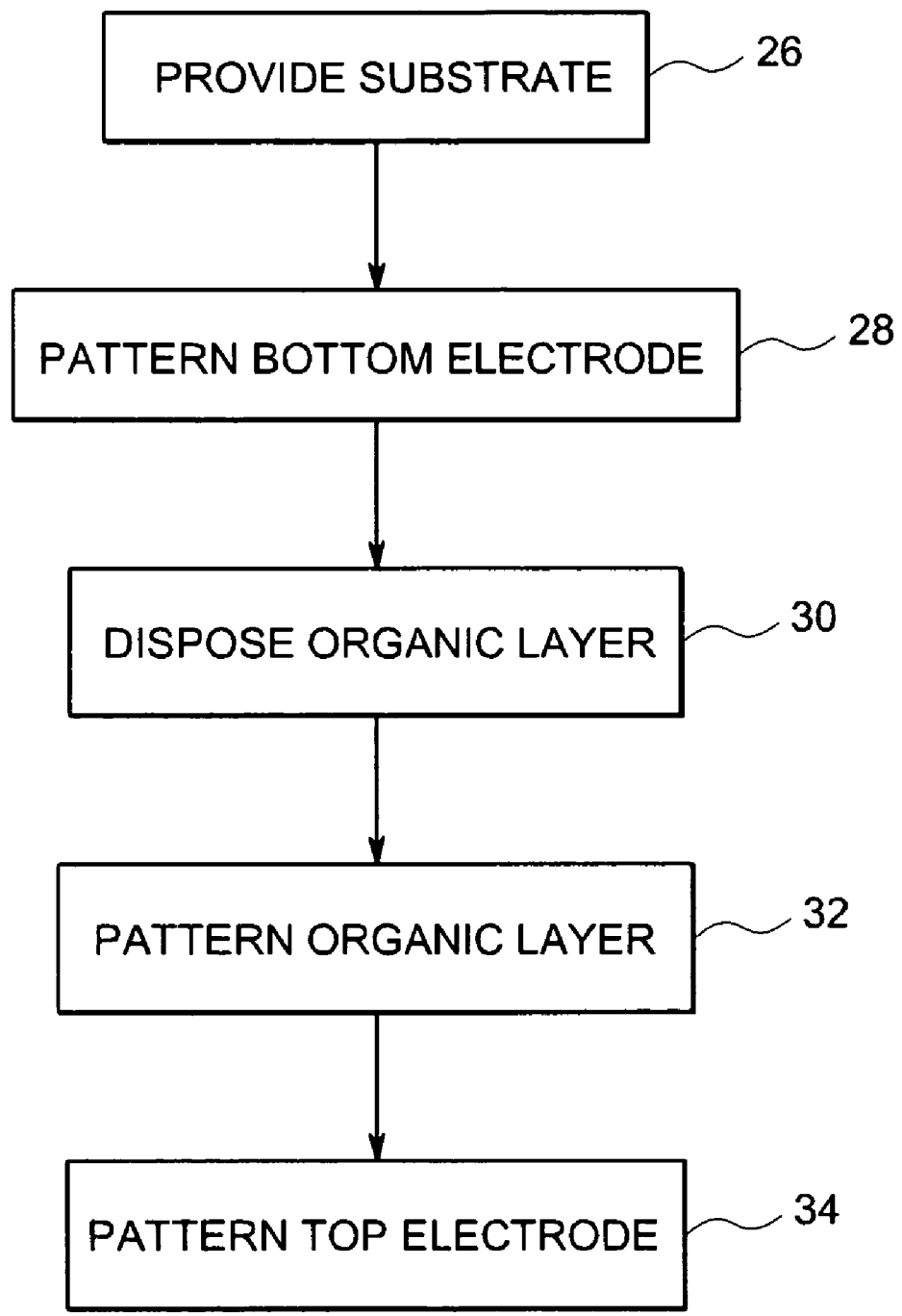
FIG. 2 is a flow chart illustrating an exemplary process of fabricating the organic device package illustrated in FIG. 1, according to aspects of the present technique.

Turning now to FIG. 2, a flow chart depicting an exemplary method for fabricating an organic device package, in accordance with aspects of the present technique, is illustrated. In one embodiment, the organic device package 10 (see FIG. 1) may include a plurality of organic electronic elements electrically coupled in series to form a sub-group, where each of the plurality of organic electronic elements may include a respective bottom electrode and top electrode. Further, a plurality of sub-groups may be electrically coupled in parallel to form a group of organic electronic elements. Additionally, a plurality of groups of organic electronic elements may be electrically coupled in series to form an organic device package 10 that is tolerant to both electrical shorts and electrical opens.

The method summarized in FIG. 2 begins at step 26. In step 26, a substrate is provided. In one embodiment, the substrate may include a flexible substrate, such as, but not limited to, plastic, a metal foil, or flexible glass. Alternatively, the substrate may include non-flexible substrates, such as, but not limited to, plastic, glass, silicon, a metal foil or combinations thereof. Further, the substrate may be substantially transparent or opaque, depending on the intended direction of light emission. Accordingly, for bottom-emitting organic electronic elements, the substrate may be substantially transparent. As used herein, "substantially transparent" refers to a material allowing a total transmission of at least about 50%, preferably at least about 80%, of visible light. Alternatively, for top-emitting organic electronic elements, light may be transmitted from the organic electronic element through the top electrodes. Consequently, the substrate may be opaque.

At step 28, a plurality of bottom electrodes may be patterned on the substrate. In one embodiment, each of the plurality of bottom electrodes may include an anode. It may be noted that the electrodes that are patterned first are referred to as the "bottom" electrodes since they embody the bottom electrodes during operational use of the organic device package. The plurality of bottom electrodes may include a first material that is transparent to the light emitted by the organic device package. For example, the first material may include indium tin oxide (ITO), or tin oxide. In addition, a thickness of the bottom electrode may be in a range from about 10 nm to about 100 μnm preferably in a range from about 10 nm to about 1 μm, more preferably in a range from about 10 nm to about 200 nm and even more preferably in a range from about 50 nm to about 200 nm. In certain embodiments, the plurality of bottom electrodes may include a first material that is transparent to the light absorbed by the organic device package. Furthermore, in certain other embodiments, the plurality of bottom electrodes may include a first material that is transparent to the light modulated by the organic device package.

Subsequently, at step 30, one or more organic layers may be disposed on the plurality of bottom electrodes. The organic layers may be disposed by employing techniques, such as, but not limited to, spin-coating, ink-jet printing, direct and indirect gravure coating, screen-printing, spraying, or physical vapor deposition. The organic layers may serve as an intermediate layer between the respective electrodes of each of the plurality of organic electronic elements. Typically, the overall thickness of the organic layers may be in a range from about 1 nm to about 1 mm, preferably in a range from about 1 nm to about 10 μm, more preferably in a range from about 30 nm to about 1 μm and even more preferably in a range from about 30 nm to about 200 nm.

Following the deposition of the organic layer at step 30, the organic layer may be patterned, at step 32. In one exemplary embodiment, the organic layers may be patterned such that they are coincident with the underlying bottom electrodes. Alternatively, the organic layers may form a continuous layer over the patterned bottom electrodes. Further, the organic layer may be patterned to form a plurality of openings therethrough. As will be appreciated, the openings are generally formed by creating holes in the organic layers. That is, the plurality of openings may be configured to facilitate electrical coupling between the bottom and top electrodes of the organic device package.

The plurality of openings may be formed by selective removal of the organic layer employing techniques such as laser ablation. As will be appreciated, ablation is defined as the removal of material due to incident light. The openings in the organic layer may be patterned by the selective removal of the organic layer by photochemical changes that may include a chemical dissolution of the organic layer, akin to photolithography. Typically, the organic layer may be cleared by a pressurized inert gas, such as nitrogen or argon, prior to ablating the organic layer. Alternatively, techniques such as ink-jet printing may be utilized to form the plurality of openings.

Subsequently, at step 34, a plurality of top electrodes may be patterned on the organic layer. In one embodiment, each of the plurality of top electrodes may include a cathode. It may be noted that the electrodes that are patterned last are referred to as the "top" electrodes since they embody the top electrodes during operational use of the organic device package. The plurality of top electrodes may include a second material that is transparent to light emitted by the organic device package, such as ITO. Alternatively, the plurality of top electrodes may comprise a reflective material, such as a metal, where the metal may include aluminum (Al) or silver (Ag).

Also, the thickness of the top electrode may be in a range from about 10 nm to about 100 μm, preferably in a range from about 10 nm to about 1 μm, more preferably in a range from about 10 nm to about 200 nm and even more preferably in a range from about 50 nm to about 200 nm. In certain embodiments, the plurality of top electrodes may include a second material that is transparent to the light absorbed by the organic device package. Furthermore, in certain other embodiments, the plurality of top electrodes may include a second material that is transparent to the light modulated by the organic device package.

Additionally, at step 34, the plurality of top electrodes may be patterned to facilitate series coupling between a plurality of organic electronic elements. In accordance with one embodiment of the present technique, the organic device package may include at least a first organic electronic element and a second organic electronic element, where each of the first and second organic electronic elements includes respective bottom and top electrodes. In a presently contemplated configuration, series electrical coupling between the first and second organic electronic elements may be achieved via the top electrode of the first organic electronic element. In other words, the top electrode of the first organic electronic element may be patterned to electrically couple in series the first and second organic electronic elements by sizing the top electrode to span a portion of the bottom electrode of the first organic electronic element and a portion of the bottom electrode of the second organic electronic element, as will be illustrated and described further with respect to FIGS. 3-7. Consequently, the first and second organic electronic elements may be electrically coupled in series to form a sub-group, as previously described.

Alternatively, in accordance with further aspects of the present technique, the plurality of bottom electrodes may be patterned on a first substrate. Further, a plurality of top electrodes may be patterned on a second substrate. In addition, one or more organic layers may be disposed on at least one of the plurality of bottom electrodes, the plurality of top electrodes or both. Subsequently, the first and second substrates may be coupled to form an organic device package. In addition, the second substrate may be disposed such that the plurality of top electrodes disposed on the second substrate is positioned substantially opposite the plurality of bottom electrodes disposed on the first substrate. Further, the plurality of top electrodes may be patterned to facilitate series coupling between a plurality of organic electronic elements, as previously described.

Subsequently, the first and second substrates may be coupled via applying pressure to the organic device package. Alternatively, the coupling between the first and second substrates may be formed via heating the organic device package. Further, a combination of application of pressure and heat may be employed to couple the first and second substrates to form the organic device package. Additionally, the organic device package may be cured via heating the organic device package. Alternatively, the organic device package may be cured by exposing the organic device package to ultra-violet radiation.

Figure 3:
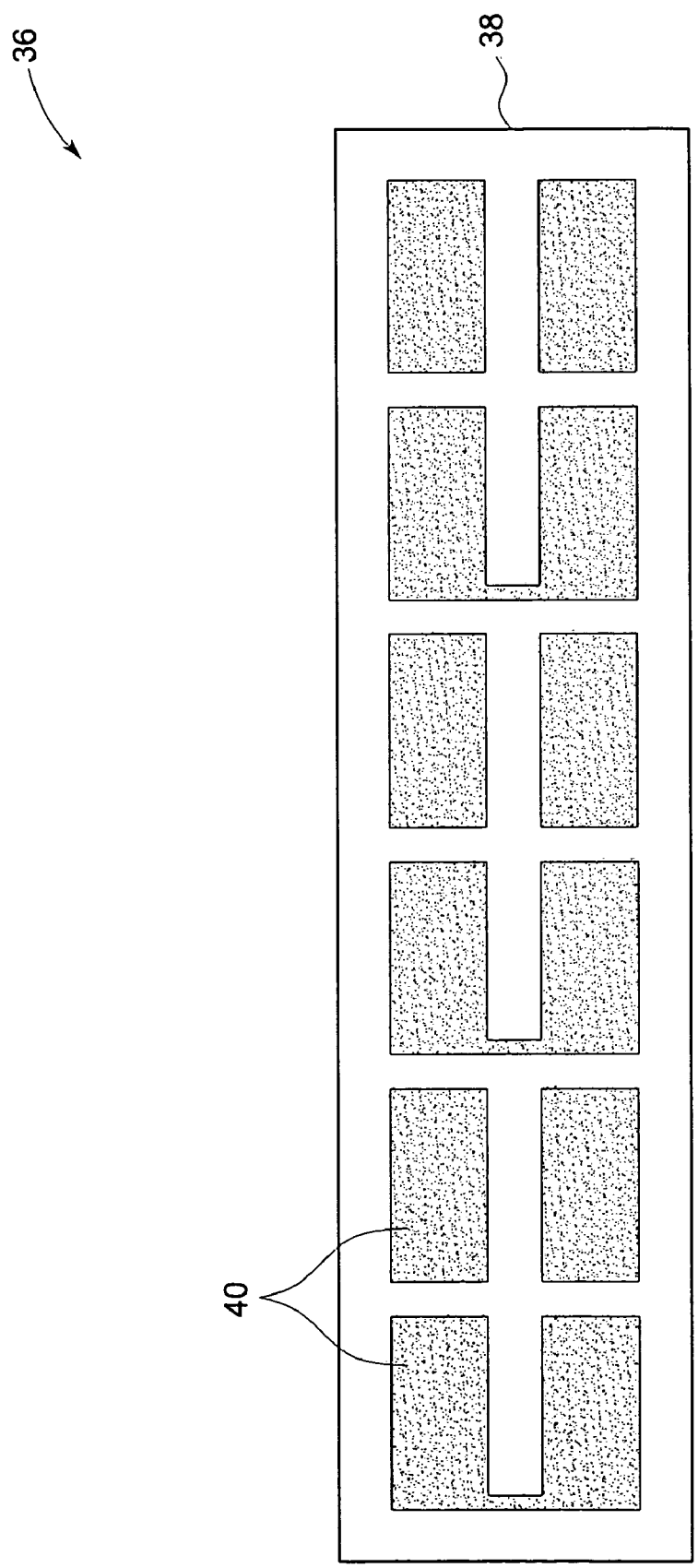
FIGS. 3-6 illustrate an exemplary process of fabricating the organic device package illustrated in FIG. 1, according to aspects of the present technique.

FIGS. 3-7 illustrate diagrammatic views representative of an exemplary process flow for fabricating an organic device package 36, corresponding to the process steps of FIG. 2. More specifically, FIG. 3 illustrates an initial step in the process of fabricating the organic device package 36. As depicted in FIG. 3, a substrate 38 may be provided. Further, a plurality of bottom electrodes 40 may be patterned on the substrate 38. In one embodiment, each of the plurality of bottom electrodes 40 may include an anode. The plurality of bottom electrodes may include a first material that is transparent to the light emitted by the organic device package 36, as previously described.

Figure 4:
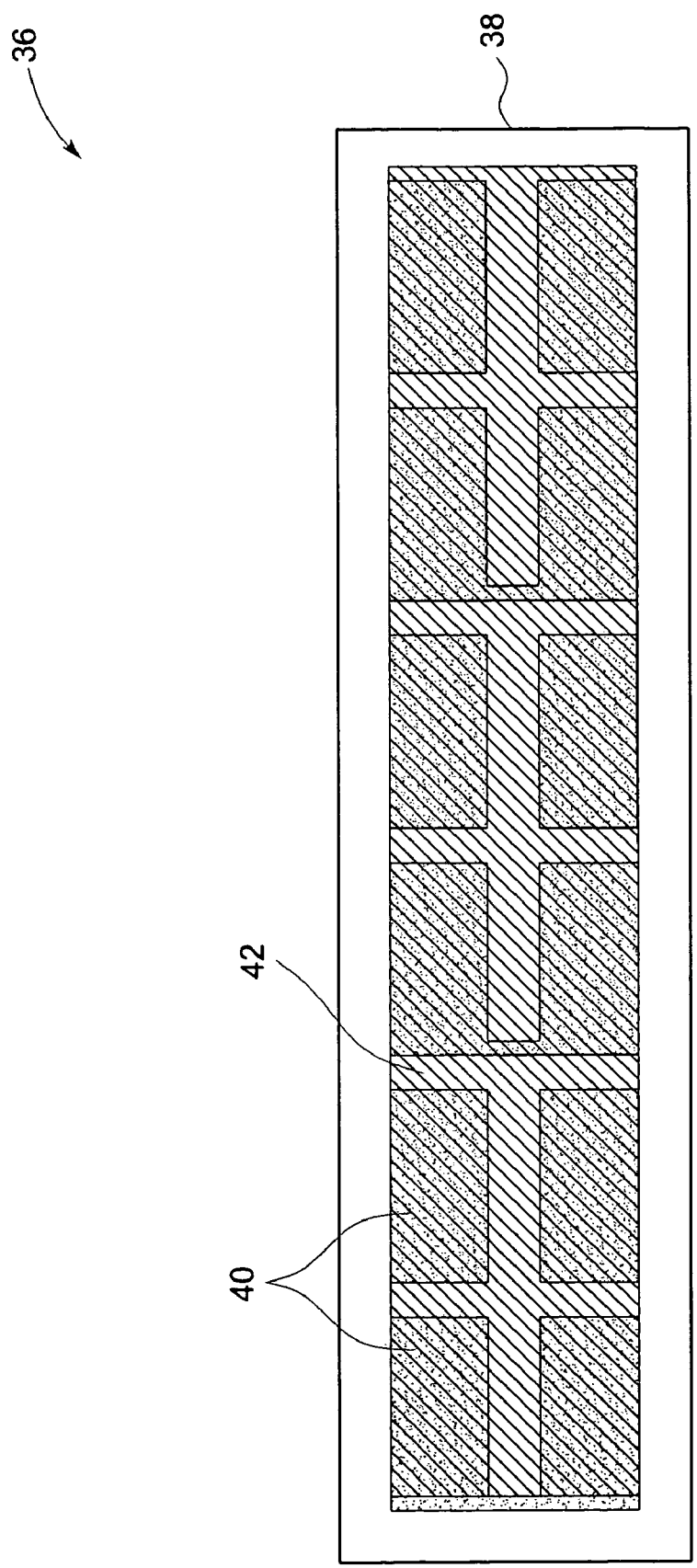
Figure 5:
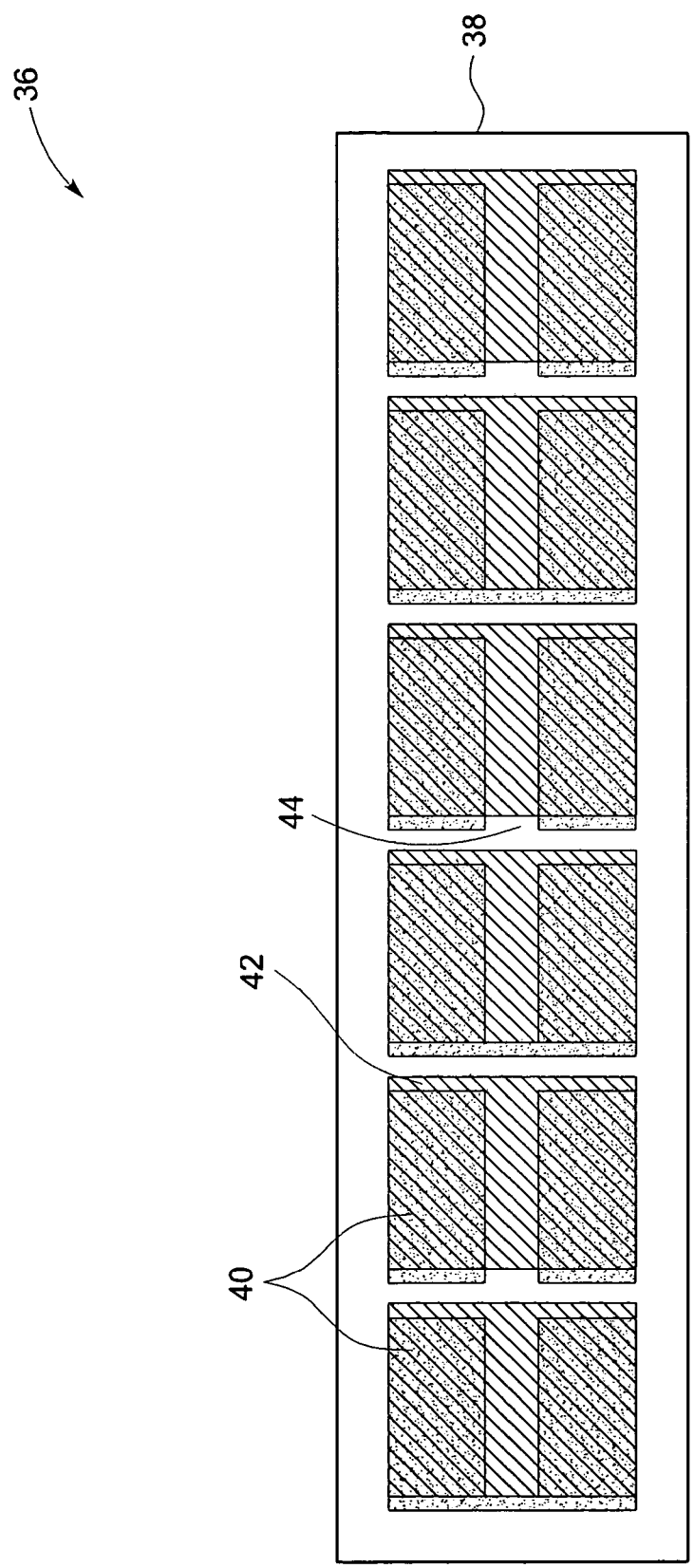

As illustrated in FIG. 4, one or more organic layers 42 may be disposed on the plurality of bottom electrodes 40. The organic layers 42 may serve as an intermediate layer between the respective electrodes of each of the plurality of organic electronic elements, as previously described. Subsequently, laser ablation or inkjet printing may be employed to etch away sections of the organic layers 42, thereby defining a plurality of openings 44 in the organic layers 42, as depicted in FIG. 5.

Figure 6:
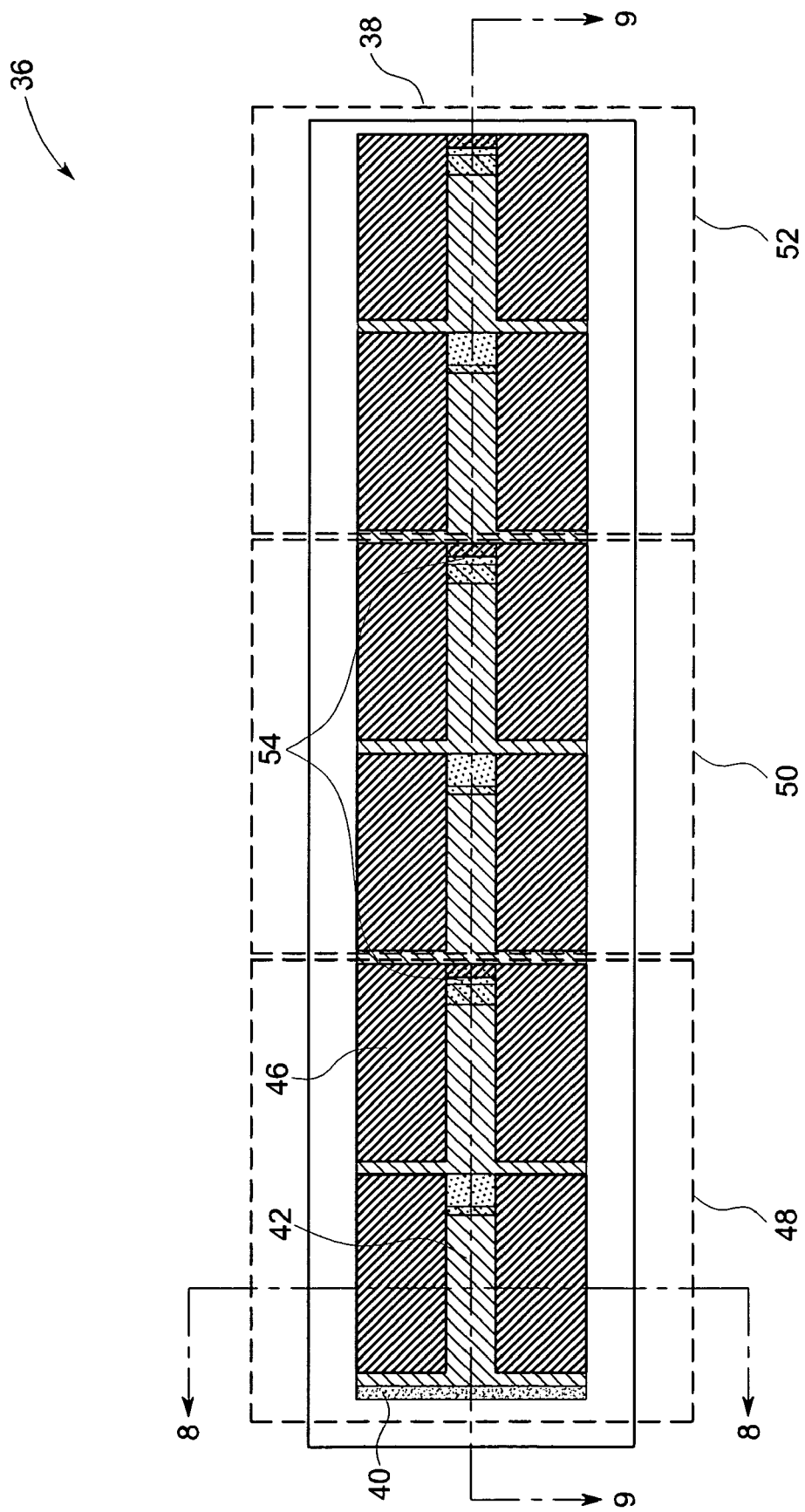

Next, a plurality of top electrodes 46 may be disposed on the organic layers 42, as illustrated in FIG. 6. As illustrated in FIG. 6, the organic device package 36 includes three groups 48, 50, 52 of organic electronic elements. The first group 48 of organic electronic elements may be electrically coupled in series with the second group 50 of organic electronic elements via a series interconnection area 54. In a similar fashion, the second group 50 of organic electronic elements may be electrically coupled in series with the third group 52 of organic electronic elements via the series interconnection area 54.

Figure 7:
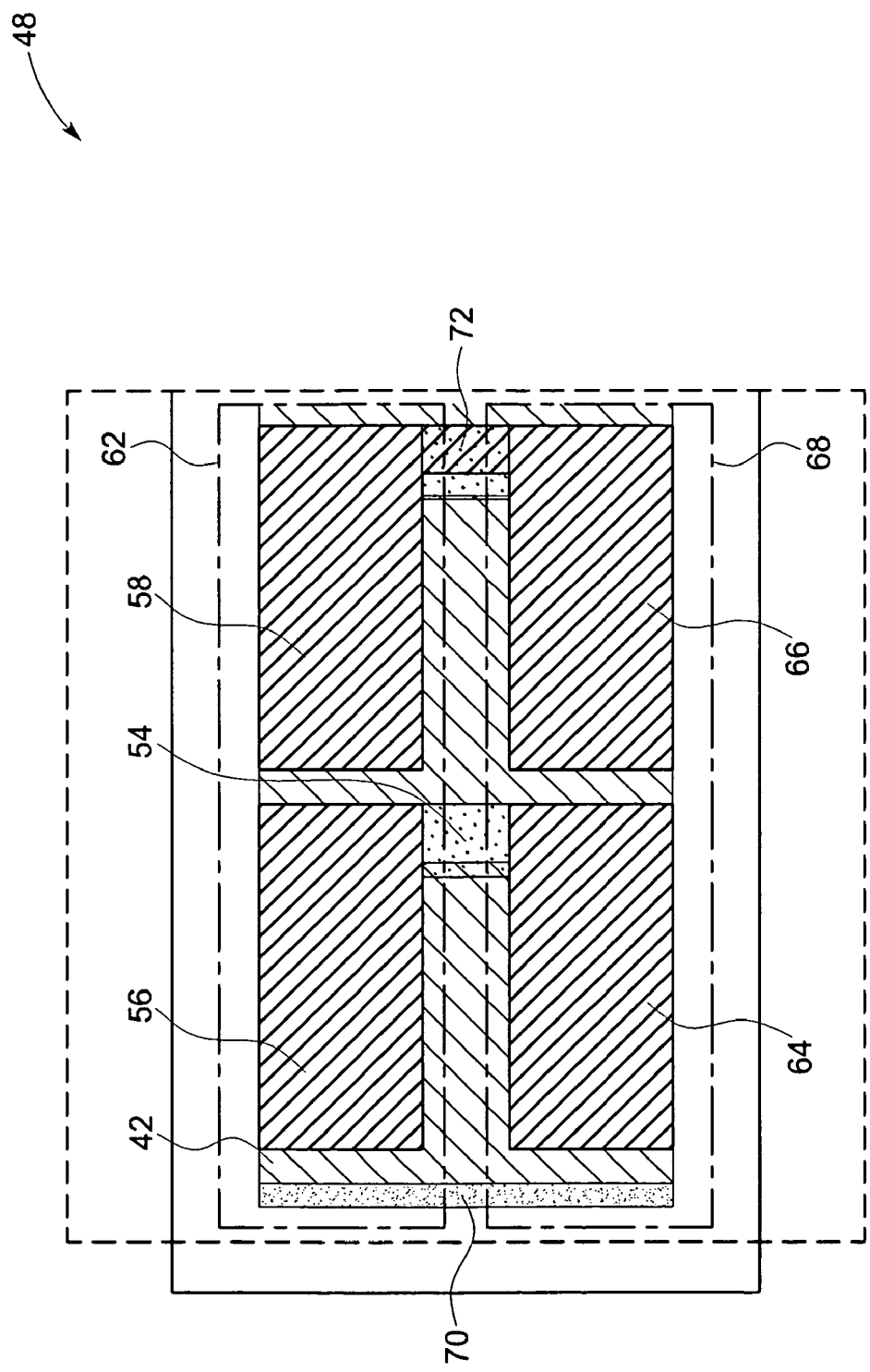
FIG. 7 is an enlarged view of a group of organic electronic elements of the organic device package of FIG. 6.

FIG. 7 illustrates an enlarged view of the first group 48 of organic electronic elements. In a presently contemplated configuration, a first organic electronic element 56 and a second organic electronic element 58 may be electrically coupled in series via the series interconnection area 54 to form a first sub-group 62 of organic electronic elements. In one embodiment, the series interconnection area 54 may be the organic layer 42. Similarly, a third organic electronic element 64 and a fourth organic electronic element 66 may be electrically coupled in series via the series interconnection area 54 to form a second sub-group 68 of organic electronic elements. Moreover, as will be appreciated, each of the first, second, third and fourth organic electronic elements includes a respective bottom electrode and a top electrode. In one embodiment, the bottom electrode is an anode and the top electrode is a cathode. As previously described, the top electrode of the first organic electronic element 56 may be electrically coupled to the bottom electrode of the second organic electronic element 58 to achieve the series coupling. Likewise, the third and fourth organic electronic elements 64, 66 may be electrically connected in series via coupling the top electrode of the third organic electronic element 64 to the bottom electrode of the fourth organic electronic element 66.

Further, the first and second sub-groups 62, 68 may be electrically coupled in parallel to form the group 48 of organic electronic elements. In a presently contemplated configuration, the parallel connection coupling the first and second sub-groups 62, 68 may be achieved via electrically coupling the bottom electrode of the first organic electronic element 56 and the bottom electrode of the third organic electronic element 64 via a first parallel interconnection area 70. Similarly, the top electrode of the second organic electronic element 58 may be electrically coupled with the top electrode of the fourth organic electronic element 66 via a second parallel interconnection area 72. Consequently, the first and second sub-groups 62, 68 of organic electronic elements are electrically coupled in parallel to form the first group 48. In certain embodiments, the first and second parallel interconnection areas 70, 72 may include a bus-line (not shown). The bus-line may be configured to electrically couple at least two electrodes, where the at least two electrodes may include two bottom electrodes or two top electrodes.

Figure 8:
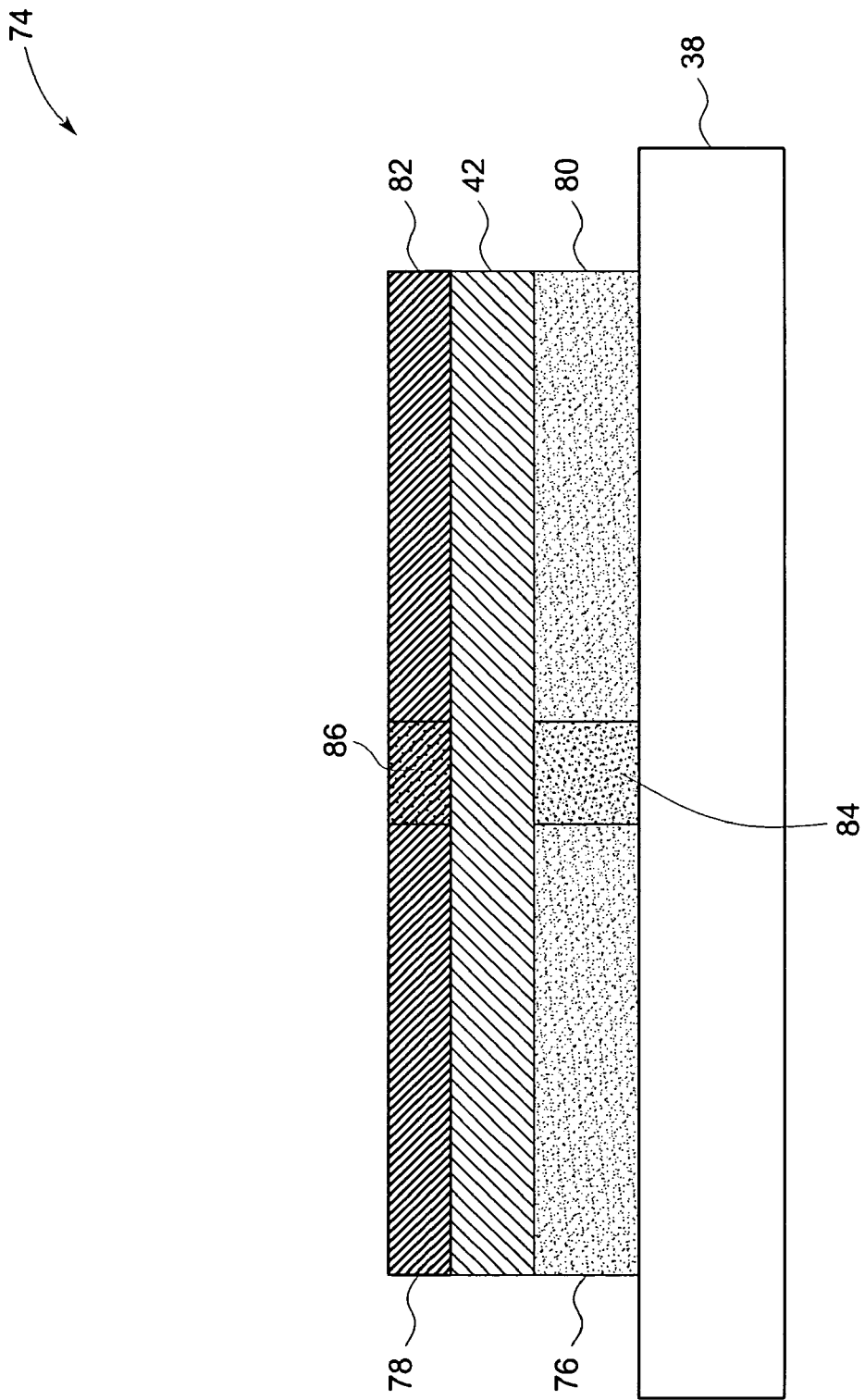
FIG. 8 is a first cross-sectional side view of an exemplary embodiment of the organic device package illustrated in FIG. 6 along the cross-sectional line 8-8, according to aspects of the present technique.

Turning now to FIG. 8, a first cross-sectional side view 74 of the exemplary organic device package 36 of FIG. 6 along the cross-sectional line 8-8 is illustrated. In FIG. 8, organic device package 74 is depicted as including at least a first organic electronic element having a bottom electrode 76 and a top electrode 78. Additionally, the organic device package 74 includes a second organic electronic element having a bottom electrode 80 and a top electrode 82. Reference numeral 84 represents a first parallel interconnection area that may be configured to electrically couple in parallel first and second sub-groups of organic electronic elements. Likewise, a second parallel interconnection area 86 may be employed to electrically couple in parallel the first and second sub-groups of organic electronic elements.

Figure 9:
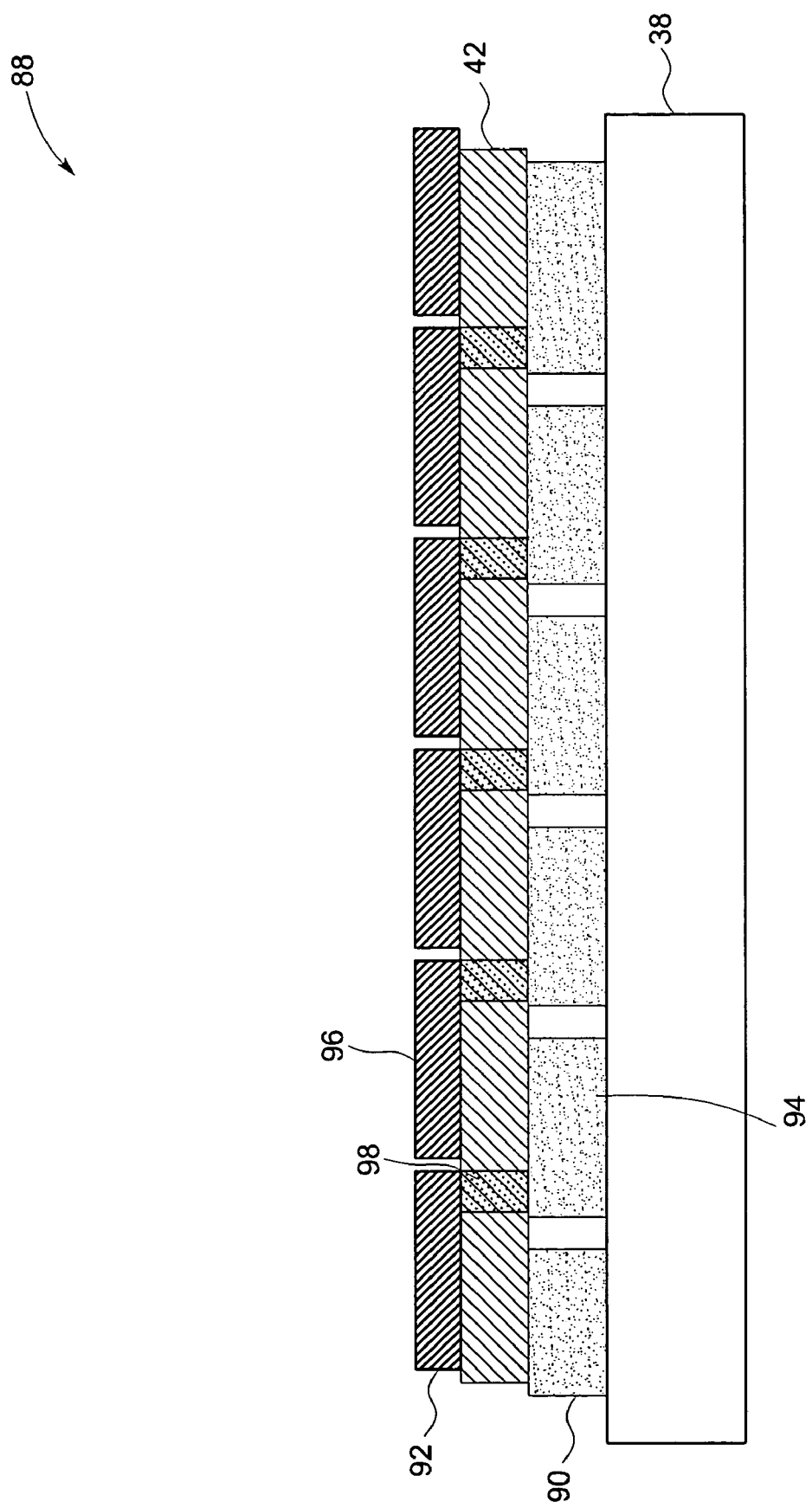
FIG. 9 is a second cross-sectional side view of an exemplary embodiment of the organic device package illustrated in FIG. 6 along the cross-sectional line 9-9, according to aspects of the present technique.

FIG. 9 depicts a second cross-sectional side view 88 of the organic device package 36 of FIG. 6 along the cross-sectional line 9-9. In FIG. 9, the organic device package 88 is depicted as including six organic electronic elements. A first organic electronic element is illustrated as having a bottom electrode 90 and a top electrode 92. Further, a second organic electronic element is illustrated as having a bottom electrode 94 and a top electrode 96. As previously described, the bottom electrodes 90, 94 may include respective anodes of the first and second organic electronic elements. Similarly, the top electrodes 92, 96 may include respective cathodes of the first and second organic electronic elements.

In accordance with aspects of the present technique, a plurality of organic electronic elements may be electrically coupled in series to form a sub-group of organic electronic elements, as previously described. In one embodiment, the top electrode 92 of the first organic electronic element may be configured to provide a series connection coupling the first and second organic electronic elements. In certain embodiments, the top electrode 92 of the first organic electronic element may be a cathode and the bottom electrode 94 of the second organic electronic element may be an anode. Consequently, the first and second organic electronic elements may be electrically coupled in series via a series interconnection area 98. The illustrated embodiment depicts a series coupling between the cathode 92 of the first organic electronic element and the anode 94 of the second organic electronic element. It may be noted that in one embodiment, the series interconnection area 98 may include a portion of the organic layer 42. As will be appreciated, the other organic electronic elements in the organic device package 88 may be electrically coupled in series via respective series interconnection areas.

Figure 10:
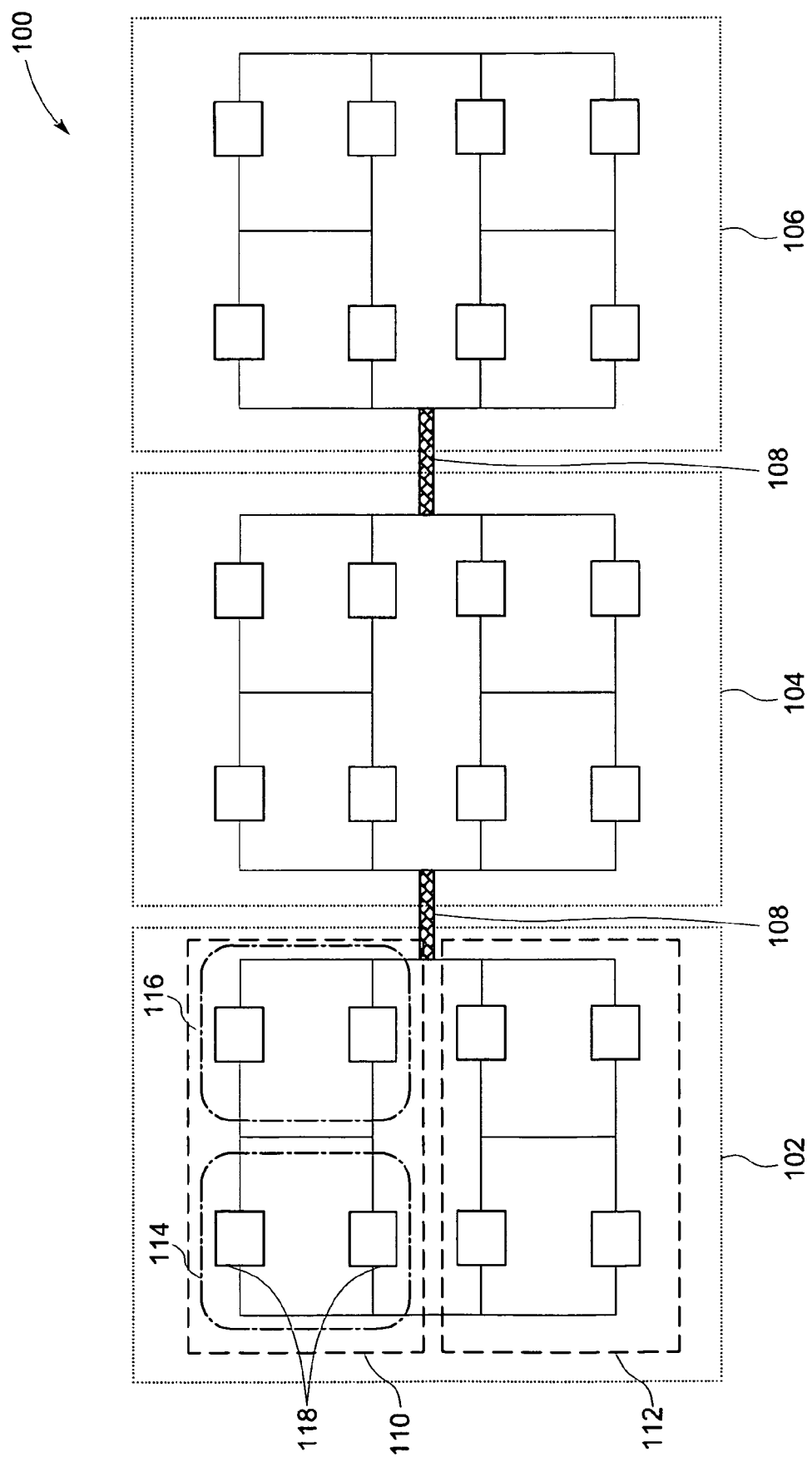
FIG. 10 illustrates another exemplary embodiment of an organic device package, according to aspects of the present technique.

Referring to FIG. 10, a second exemplary embodiment 100 of an organic device package is illustrated. In a presently contemplated configuration, the organic device package 100 is illustrated diagrammatically as having a plurality of modules of organic electronic elements. In the exemplified embodiment, the organic device package 100 is depicted as including a first module 102, a second module 104, and a third module 106 of organic electronic elements. However, as will be appreciated by one skilled in the art, in alternate embodiments of the present technique, a lesser or greater number of modules of organic electronic elements may be envisaged. The modules 102, 104, 106 of organic electronic elements may be electrically connected in a series arrangement to form the organic device package 100. Further, the first and second modules 102, 104 may be electrically coupled in series via a series interconnection area 108. Likewise, the second and third modules 104, 106 may be arranged such that the second and third modules 104, 106 are electrically coupled in series via the series interconnection area 108.

With continuing reference to FIG. 10, at least one of the plurality of modules 102, 104, 106 of organic electronic elements may include a plurality of groups of organic electronic elements that may be electrically connected with each other in a parallel configuration. In a presently contemplated configuration, the first module 102 is depicted as including two groups. However, as will be appreciated by one skilled in the art, in alternate embodiments of the present technique, a greater number of groups of organic electronic elements may be envisioned. For example, in one embodiment, the first module 102 may include a first group 110 and a second group 112. In addition, the first and second groups 110, 112 may be electrically coupled in parallel to form the first module 102, as depicted in FIG. 10.

In addition, in accordance with further aspects of the present technique, at least one of the plurality of groups 110, 112 of organic electronic elements may include a plurality of sub-groups that may be electrically coupled in a series arrangement. In the illustrated embodiment, a first sub-group 114 and a second sub-group 116 of organic electronic elements may be electrically coupled in series to form the first group 110. Correspondingly, the second group 112 may be formed by electrically coupling in series a plurality of sub-groups of organic electronic elements.

As previously described, the plurality of sub-groups of organic electronic elements may include a plurality of organic electronic elements 118 that may be electrically coupled in parallel. Moreover, each of the plurality of organic electronic elements 118 may include a respective bottom electrode and top electrode. In one embodiment, the bottom electrode may include an anode and the top electrode may include a cathode. In certain embodiments, each of the plurality of organic electronic elements 118 may include an organic electronic device. Additionally, each of the plurality of organic electronic devices may include one of an organic light emitting device, an organic photovoltaic cell, an organic electrochromic device, an organic transistor, an organic integrated circuit, an organic sensor, or a photo-detector, as previously described.

In a presently contemplated configuration, the first sub-group 114 of organic electronic elements may include a plurality of organic electronic elements 118 that may be electrically coupled in parallel. Correspondingly, the second sub-group 116 of organic electronic elements may also include a plurality of organic electronic elements 118 electrically coupled in parallel. In FIG. 10, the first and second sub-groups 114, 116 are illustrated as each having two organic electronic elements 118 electrically coupled in parallel. However, as will be appreciated by one skilled in the art, the first and second sub-groups 114, 116 may include more than two organic electronic elements 118 electrically coupled in parallel.

With continuing reference to FIG. 10, an exemplary embodiment of the organic device package 100 having a "four-tier architecture" is depicted. In other words, a Series/Parallel/Series/Parallel model of the organic device package 100 is depicted in FIG. 10. The plurality of organic electronic elements 118 is electrically coupled in parallel to form a sub-group of organic electronic elements. Further, the plurality of sub-groups 114, 116 of organic electronic elements is electrically coupled in series to form a group of organic electronic elements. In addition, the plurality of groups 110, 112 of organic electronic elements is electrically coupled in parallel to form a module of organic electronic elements. Additionally, a plurality of modules 102, 104, 106 is electrically coupled in series to form the organic device package 100.

As previously described with reference to FIG. 1, the exemplary four-tier architecture 100 illustrated in FIG. 10 is also fault tolerant to both electrical opens and electrical shorts. In addition, the four-tier architecture 100 does not entail the use of a fuse to provide fault tolerance to electrical shorts, as previously noted.

It may be noted that the various embodiments of the organic device package depicted in FIG. 1 and FIG. 10 are shown for illustrative purposes. However, various other embodiments of the organic device package, in accordance with exemplary aspects of the present invention, may be envisaged. As described hereinabove, a plurality of organic electronic elements may be electrically connected in a series arrangement to form series blocks. Likewise, a plurality of organic electronic elements may be electrically connected in a parallel arrangement to form parallel blocks. The series blocks and parallel blocks may then be nested to form a grid network. Accordingly, a variety of embodiments of the grid network may be formed by various arrangements of the series and parallel blocks.

Figure 11:
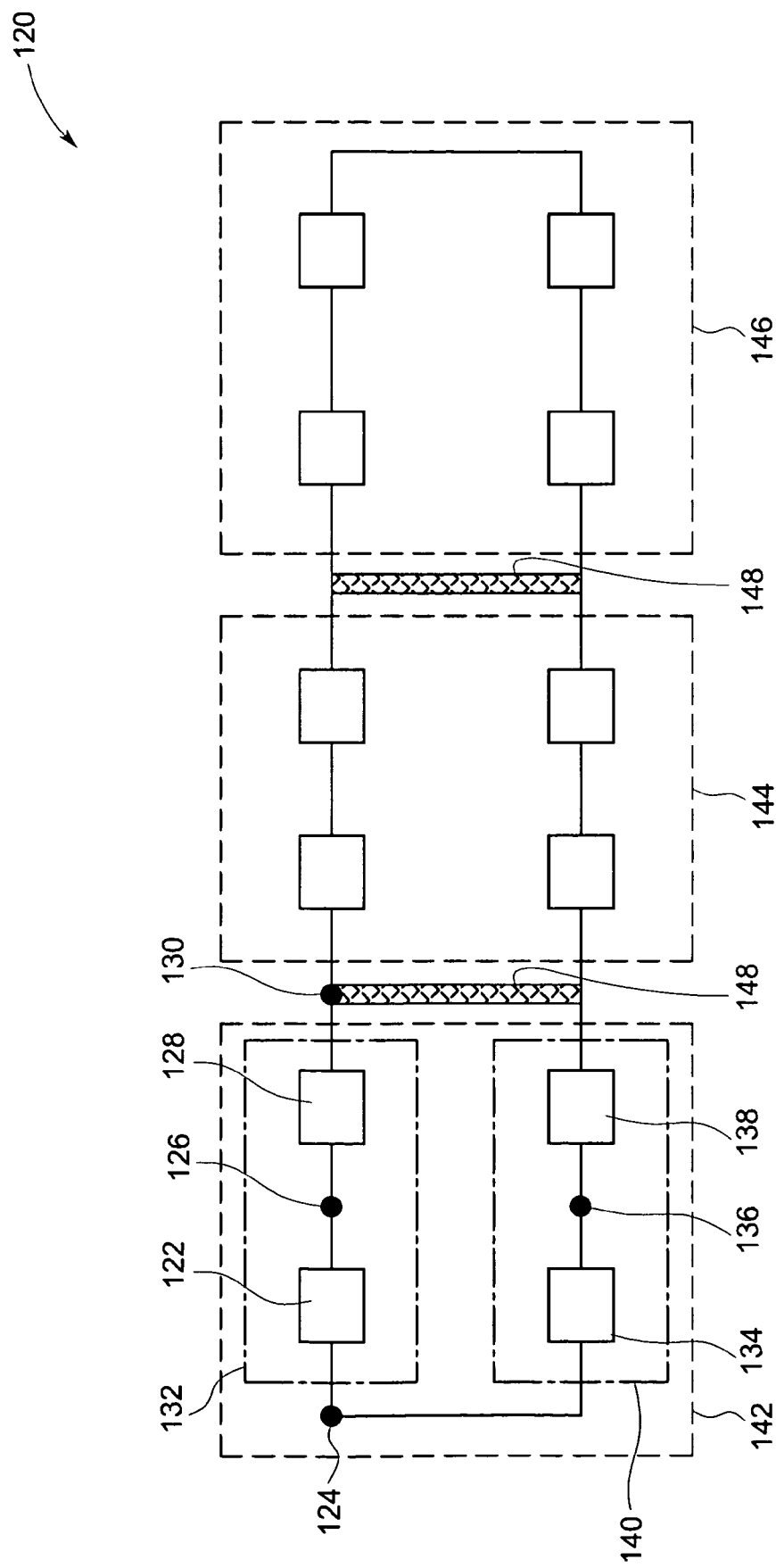
FIG. 11 illustrates yet another exemplary embodiment of an organic device package, according to aspects of the present technique.

Turning to FIG. 11 an exemplary embodiment 120 of the organic device package 10 of FIG. 1 is illustrated. In this embodiment, the organic device package 120 may be formed by arranging a plurality of organic electronic elements between a plurality of nodes. As used herein, a "node" is used to represent a connection point between organic electronic elements. Also, each of the plurality of organic electronic elements may include an organic electronic device.

In a presently contemplated configuration, a first organic electronic element 122 may be coupled between a first node 124 and a second node 126. Similarly, a second organic electronic element 128 may be coupled between the second node 126 and a third node 130. Consequent to coupling the first organic electronic element 122 between the first and second nodes 124, 126 and coupling the second organic electronic element 128 between the second and third nodes 126, 130, a first sub-group 132 of organic electronic elements may be formed. It may be noted that the first and second organic electronic elements 122, 128 are electrically coupled in series to form the first sub-group 132.

A third organic electronic element 134 may be coupled between the first node 124 and a fourth node 136. Likewise, a fourth organic electronic element 138 may be coupled between the fourth node 136 and the third node 130. As a result, the third and fourth organic electronic elements 134, 138 are electrically coupled in series to form a second sub-group 140 of organic electronic elements.

Furthermore, as described hereinabove, the first and second sub-groups 132, 140 may be electrically coupled in parallel to form a first group 142 of organic electronic elements. Likewise, a plurality of sub-groups of organic electronic elements may be electrically coupled in parallel to form a second group 144 and a third group 146 of organic electronic elements. The plurality of groups 142, 144, 146 may then be electrically coupled in series to form the organic device package 120. For example, the first and second groups 142, 144 may be electrically coupled in series via a series interconnection area 148. The second and third groups 144, 146 of organic electronic elements may likewise be electrically coupled in series via the series interconnection area 148. Thus, the embodiment depicted in FIG. 11 illustrates a three-tier, Series/Parallel/Series architecture of the exemplary organic device package 120.

The various embodiments of the organic device package and the method of fabricating the organic device package described hereinabove enable fabrication of an organic device package that advantageously provides full fault tolerance against both electrical shorts and electrical opens. Further, various embodiments are contemplated where a plurality of series blocks and parallel blocks may be nested to provide a grid network having increased flexibility and fault tolerance. In addition, employing the various embodiments of the organic device package and the method of fabrication described hereinabove, full fault tolerance against electrical shorts and electrical opens without the use of a fuse that advantageously circumvents the limitations of current techniques may be achieved.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An organic device package comprising a plurality of groups of organic electronic elements electrically coupled in series, wherein at least one group of the plurality of groups of organic electronic elements comprises a plurality of sub-groups of organic electronic elements electrically coupled in a substantially planar parallel connection, wherein the substantially planar parallel connection is along a plane substantially parallel to a plane of the device, and wherein at least one of the plurality of sub-groups of organic electronic elements comprises a plurality of organic electronic elements electrically coupled in series, wherein a first organic electronic element of a sub-group of the plurality of sub-groups comprises a first top electrode and a first bottom electrode and a second organic electronic element of the subgroup comprises a second top electrode and a second bottom electrode, wherein the first organic element and the second organic element are electrically coupled in a substantially planar series connection, wherein the substantially planar series connection is along a plane substantially perpendicular to the plane of the device, wherein the plurality of groups of organic electronic elements are disposed over a single substrate.

2. The organic device package of claim 1, wherein each of the plurality of organic electronic elements comprises an organic electronic device.

3. The organic device package of claim 2, wherein each of the plurality of organic electronic devices comprises one of an organic light emitting device, an organic photovoltaic cell, an organic electrochromic device, an organic sensor, or combinations thereof.

4. The organic device package of claim 1, wherein each of the plurality of organic electronic elements comprises a bottom electrode and a top electrode.

5. The organic device package of claim 4, wherein the bottom electrode is an anode and the top electrode is a cathode.

6. The organic device package of claim 4, wherein the bottom electrode comprises a first conducting material that is transparent to light emitted, absorbed, modulated, or combinations thereof by the organic device package.

7. The organic device package of claim 6, wherein the first conducting material comprises indium tin oxide.

8. The organic device package of claim 4, wherein the top electrode comprises a second conducting material that is transparent to light emitted, absorbed, modulated, or combinations thereof by the organic device package.

9. The organic device package of claim 1, wherein the organic device package comprises at least a first organic electronic element and a second organic electronic element, wherein a top electrode of the first organic electronic element is configured to electrically couple respective bottom electrodes of the first and second organic electronic elements via spanning a portion of the bottom electrode of first organic electronic element and a portion of the bottom electrode of the second organic electronic element.

10. The organic device package of claim 1, wherein the organic device package comprises at least a first organic electronic element and a second organic electronic element, wherein a top electrode of the first organic electronic element spans a portion of the bottom electrode of the first organic electronic element and a portion of the bottom electrode of the second organic electronic element and is configured to enable the electrical coupling of the first and second organic electronic elements in series.

11. The organic device package of claim 1, wherein a top electrode of at least one organic electronic element of a first group spans a portion of the bottom electrode of the at least one organic electronic element of the first group and a portion of the bottom electrode of at least one organic electronic element of a second group and is configured to enable electrical coupling of the first and second groups in series.

12. The organic device package of claim 1, wherein the plurality of groups are disposed over a single substrate.

13. The organic device package of claim 12, wherein the plurality of groups form an integrated device structure with the substrate.

14. An organic device package comprising a plurality of modules of organic electronic elements electrically coupled in series, wherein at least one of plurality of the modules of organic electronic elements comprises a plurality of groups of organic electronic elements electrically coupled in parallel, and wherein at least one of the plurality of groups of organic electronic elements comprises a plurality of sub-groups of organic electronic elements electrically coupled in series, and wherein at least one of the plurality of sub-groups of organic electronic elements comprises a plurality of organic electronic elements electrically coupled in parallel, wherein the organic device package comprises at least a first organic electronic element and a second organic electronic element coupled in series, wherein a top electrode of the first organic electronic element is configured to electrically couple respective bottom electrodes of the first and second organic electronic elements via spanning a portion of the bottom electrode of first organic electronic element and a portion of the bottom electrode of the second organic electronic element, wherein the top electrode of the first organic element is coupled to the bottom of the second organic element in a substantially planar connection, wherein the planar connection is along a plane substantially perpendicular to the plane of the device, wherein the organic device package comprises at least a third organic electronic element and a fourth organic electronic element coupled in parallel, wherein the respective top electrodes of the third and fourth organic elements are connected in a substantially planar connection and the respective bottom electrodes of the third and fourth electronic element are electrically coupled in a substantially planar parallel connection, wherein the substantially planar parallel connections are along a plane substantially perpendicular to the plane of the device, wherein at least one of the plurality of modules is disposed over a single substrate.

15. The organic device package of claim 14, wherein each of the plurality of organic electronic elements comprises an organic electronic device.

16. The organic device package of claim 14, wherein each of the plurality of organic electronic elements comprises a bottom electrode and a top electrode.

17. The organic device package of claim 16, wherein the bottom electrode is an anode and the top electrode is a cathode.

18. An organic device package comprising:
a network of a plurality of groups, wherein the plurality of groups are electrically connected in series, wherein each of the plurality of groups comprises:
a first organic electronic element coupled between a first node and a second node;
a second organic electronic element coupled between the second node and a third node, wherein the first and second organic electronic elements are electrically coupled in a substantially planar series connection to form a first sub-group;
a third organic electronic element coupled between the first node and a fourth node; and
a fourth organic electronic element coupled between the fourth node and the third node, wherein the third and fourth organic electronic elements are electrically coupled in a substantially planar series connection to form a second sub-group, and wherein the first and second sub-groups are electrically coupled in a planar parallel connection to form a group;
wherein the substantially planar series connections are along a plane substantially perpendicular to the plane of the device, and the substantially planar parallel connections are along the plane of the device, wherein the organic device package is a unitary device package fabricated on a single substrate.

19. The organic device package of claim 18, further comprising a plurality of groups electrically coupled in series.

20. The organic device package of claim 18, wherein each of the plurality of organic electronic elements comprises a bottom electrode and a top electrode.

21. The organic device package of claim 20, wherein the bottom electrode is an anode and the top electrode is a cathode.

22. An organic device package comprising a plurality of modules of organic electronic elements electrically coupled in a substantially planar series connection, wherein the plurality of modules are disposed over a single substrate and wherein at least one of plurality of the modules of organic electronic elements comprises a plurality of groups of organic electronic elements electrically coupled in a substantially planar parallel connection, and wherein at least one of the plurality of groups of organic electronic elements comprises a plurality of sub-groups of organic electronic elements electrically coupled in a substantially planar series connection, and wherein at least one of the plurality of sub-groups of organic electronic elements comprises a plurality of organic electronic elements electrically coupled in a substantially planar parallel connection, wherein the substantially planar series connections are series connections along a plane substantially perpendicular to the plane of the device, and the substantially planar parallel connections are parallel connections along the plane of the device.

23. The organic device package of claim 22, wherein the plurality of modules form an integrated device structure with the substrate.

24. The organic device package of claim 22, wherein the organic device package comprises at least a first organic electronic element and a second organic electronic element, wherein a top electrode of the first organic electronic element spans a portion of the bottom electrode of first organic electronic element and a portion of the bottom electrode of the second organic electronic element and is configured to enable the electrical coupling of the first and second organic electronic elements in parallel.

* * * * *